(12) United States Patent
Saifullah et al.

(10) Patent No.: US 9,904,165 B2
(45) Date of Patent: Feb. 27, 2018

(54) METHOD OF REDUCING THE DIMENSION OF AN IMPRINT STRUCTURE ON A SUBSTRATE

(75) Inventors: M. S. M. Saifullah, Singapore (SG); Hazrat Hussain, Singapore (SG); Suhui Lim, Singapore (SG); Hong Yee Low, Singapore (SG); Wei Wei Loh, Singapore (SG)

(73) Assignee: Agency For Science, Technology And Research, Singapore (SG)

( * ) Notice: Subject to any disclaimer, the term of this patent is extended or adjusted under 35 U.S.C. 154(b) by 457 days.

(21) Appl. No.: 12/849,954

(22) Filed: Aug. 4, 2010

(65) Prior Publication Data

US 2011/0031658 A1 Feb. 10, 2011

Related U.S. Application Data

(60) Provisional application No. 61/231,147, filed on Aug. 4, 2009.

(51) Int. Cl.
*G03F 7/00* (2006.01)
*B29C 43/02* (2006.01)
*B82Y 10/00* (2011.01)
*B82Y 40/00* (2011.01)

(52) U.S. Cl.
CPC .......... *G03F 7/0002* (2013.01); *B29C 43/021* (2013.01); *B82Y 10/00* (2013.01); *B82Y 40/00* (2013.01); *B29C 2043/025* (2013.01)

(58) Field of Classification Search
CPC .................................................. G03F 7/0002
USPC ....................................................... 264/319
See application file for complete search history.

(56) References Cited

PUBLICATIONS

Goh et al. ("Nanostructuring Titania by Embossing with Polymer Molds Made from Anodic Alumina Templates" Nano Letters vol. 5, No. 8, 2005, pp. 1545-1549).*
Lee et al. ("High-Refractive-Index Thin Films Prepared from Trialkoxysilane-Capped Poly(methyl methacrylate)-Titania Materials" Chem. Mater. 2001, 13, 1137-1142).*
Large area direct nanoimprinting of SiO2—TiO2 gel gratings for optical applications. J. of Vacuum Science & Technology B 21, 660 (2003).*
Brinker, "Hydrolysis and Condensation of Silicates: Effects on Structure," J. of Non-Crystalline Solids, 100:31-50, 1988.

* cited by examiner

*Primary Examiner* — Larry W Thrower
(74) *Attorney, Agent, or Firm* — Gavrilovich, Dodd & Lindsey LLP

(57) ABSTRACT

A method of reducing the dimension of an imprint structure on a substrate, the method comprising the steps of:
 (a) providing a substrate having at least one imprint structure thereon, said structure being formed of an inorganic-organic compound comprising an inorganic moiety and a polymer moiety, said polymer moiety having a lower vaporization temperature than the melting point of said inorganic moiety; and
 (b) selectively removing at least part of the polymer moiety while enabling at least part of the inorganic moiety to form a substantially continuous inorganic phase in said imprint structure, wherein the removal of the at least part of the polymer moiety from the imprint structure reduces the dimension of the imprint structure.

19 Claims, 7 Drawing Sheets

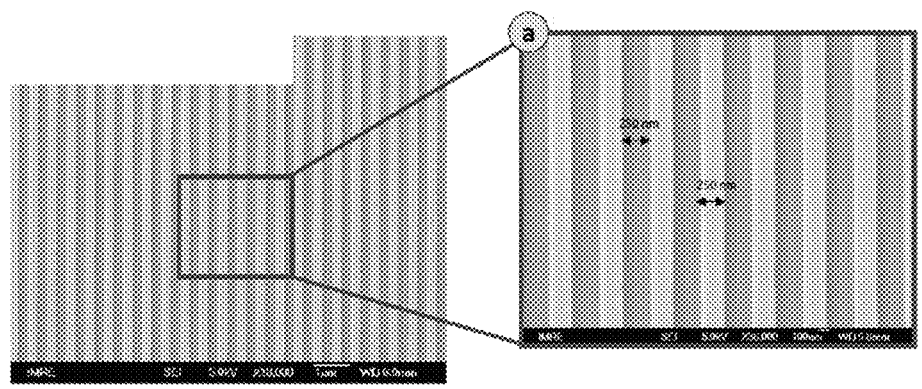
Fig. 7a(i)  Fig. 7a(ii)
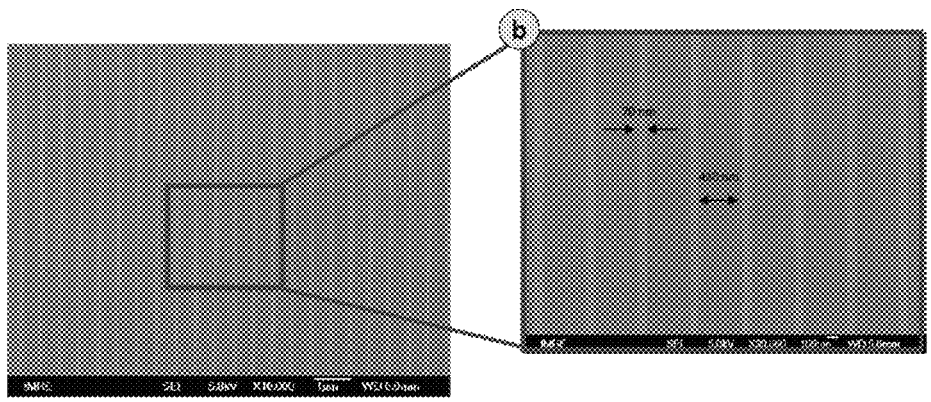
Fig. 7b(i)  Fig. 7b(ii)

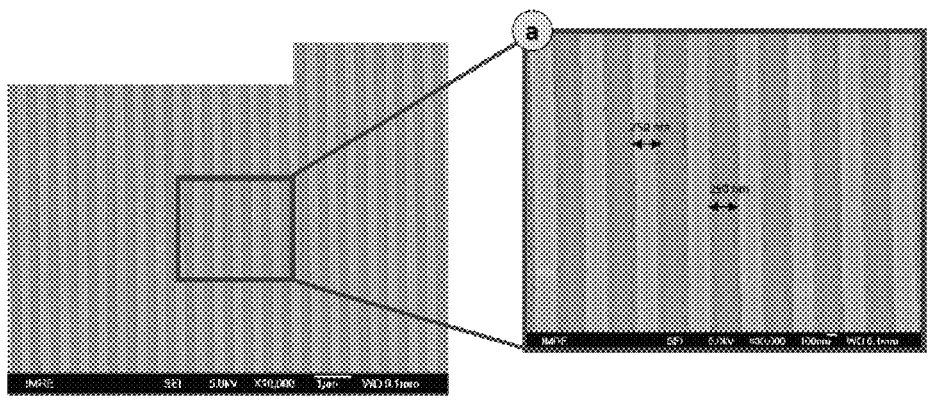
Fig. 8a(i)  Fig. 8a(ii)
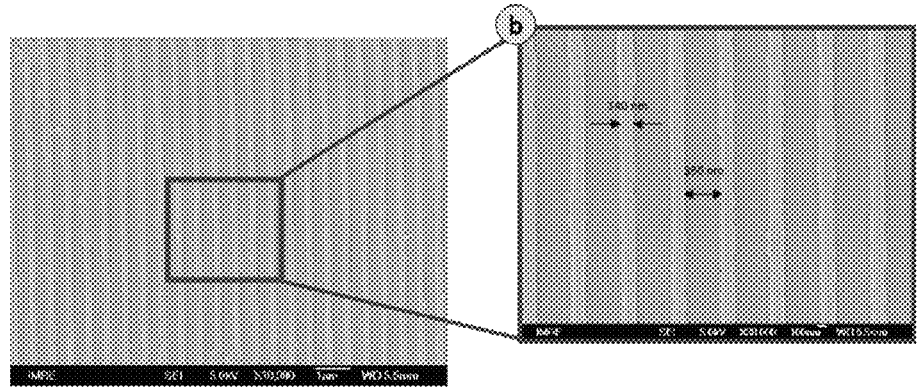
Fig. 8b(i)  Fig. 8b(ii)

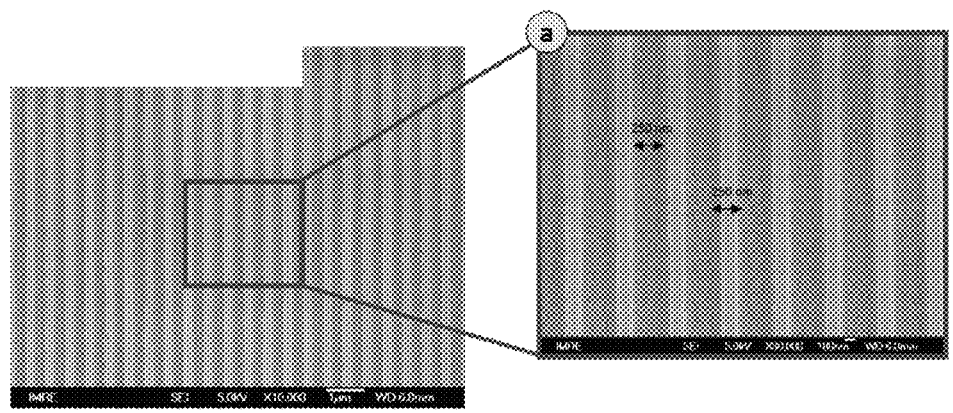
Fig. 9a(i)   Fig. 9a(ii)
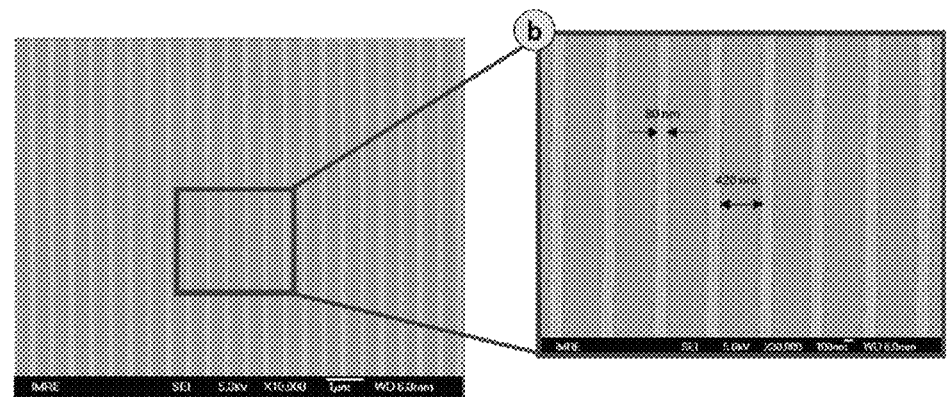
Fig. 9b(i)   Fig. 9b(ii)

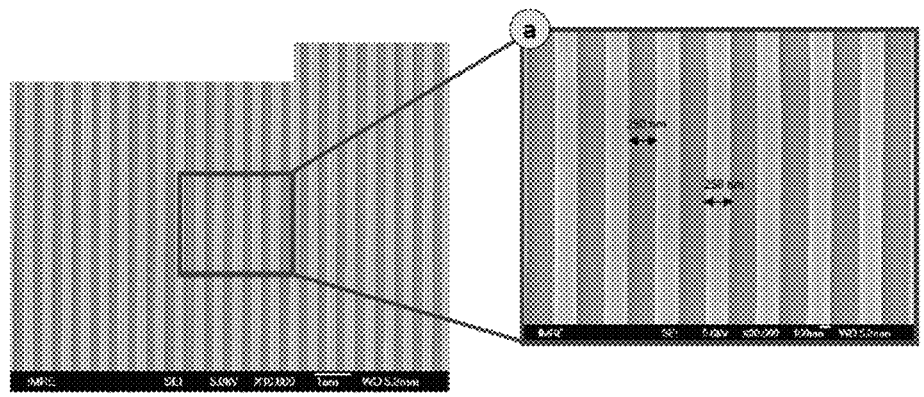
Fig. 10a(i)    Fig. 10a(ii)
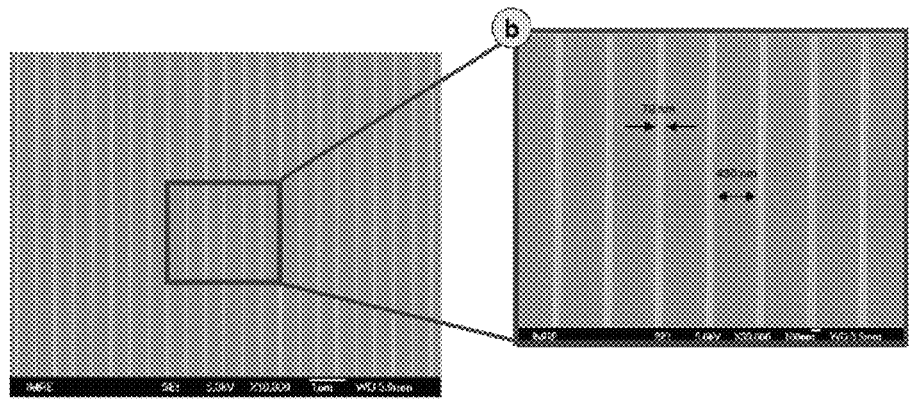
Fig. 10b(i)    Fig. 10b(ii)

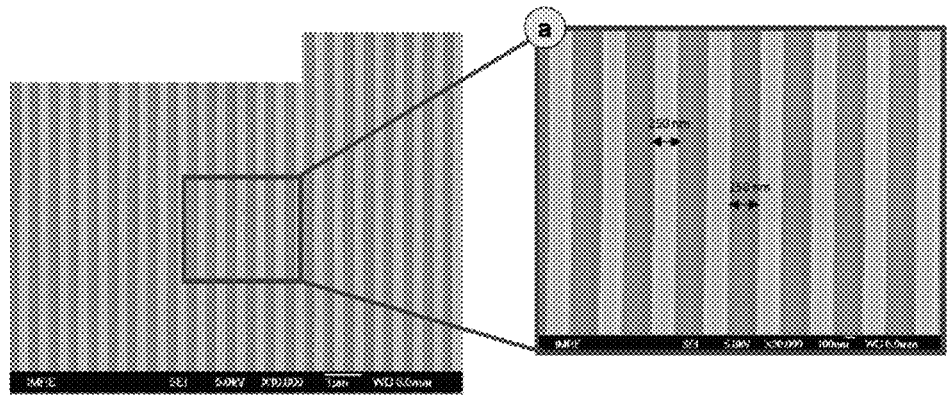
Fig. 11a(i)          Fig. 11a(ii)
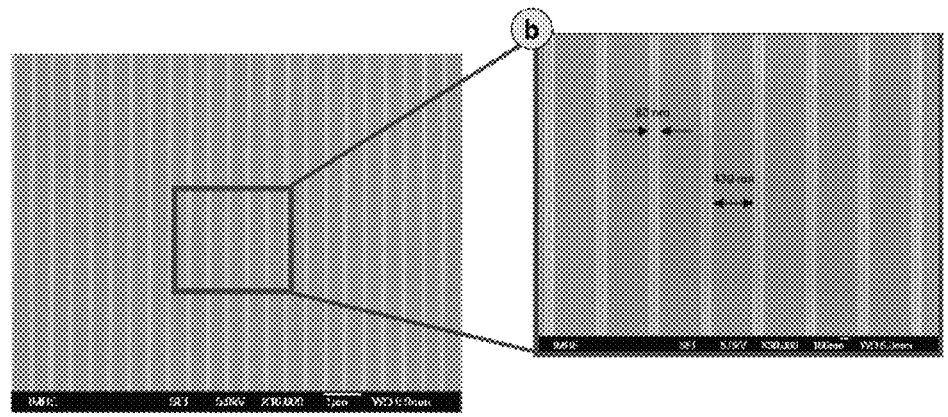
Fig. 11b(i)          Fig. 11b(ii)

METHOD OF REDUCING THE DIMENSION OF AN IMPRINT STRUCTURE ON A SUBSTRATE

CROSS REFERENCE TO RELATED APPLICATIONS

This application claims priority under 35 U.S.C. § 119 to U.S. Provisional Application Ser. No. 61/231,147, filed Aug. 4, 2009. The disclosure of which is incorporated herein by reference.

TECHNICAL FIELD

The present invention generally relates to a method of reducing the dimension of an imprint structure on a substrate. The present invention also relates to a substrate with imprint structures thereon obtained by said method.

BACKGROUND

There are many industrial applications for techniques that enable controlled patterning of surfaces, such as in the fabrication of semiconductor wafers and data storage media. Advances in patterning technology (including techniques like electron-beam lithography, two-photon processing, electrohydrodynamic lithography and nano-imprint lithography) have also enabled new functional materials and smaller, more complex features, opening up new markets in areas ranging from solar cells and displays to antibacterial coatings for consumer products.

Optical lithography in particular has been established as a cost-effective method for patterns with feature dimensions of more than 100 nm. However, methods for controlled patterning in the nanoscale range (and in particular less than 100 nm) are still expensive and inefficient. In particular, methods like electron beam lithography require expensive equipment investments and have low throughput, especially for writing dense patterns over large-area substrates.

Since its introduction, nanoimprint Lithography ("NIL") has emerged as a simple alternative with low cost and high throughput that lends itself to three-dimensional patterning through various modifications of the process. Furthermore, rapid development of this technique in the past decade has expanded its potential to fabricate features smaller than 100 nm. However, NIL is not without its drawbacks, which for example include expensive consumables, high error-rates and an inherent limitation to about 1:1 pattern replication.

NIL defines patterning through deformation of materials under suitable pressure and temperature. In a known process for NIL, a thin layer of imprint resist (thermoplastic polymer) is spin-coated onto a sample substrate. A mold having predefined topological patterns is brought into contact with the sample and pressed into the polymer coating under a certain pressure and at a temperature above the glass transition temperature of the polymer to allow the pattern on the mold to be pressed into the melt polymer film. After being cooled down, the mold is separated from the sample and the pattern resist is left on the substrate. A pattern transfer process, such as reactive ion etching (RIE) is used to transfer the pattern in the resist to the underneath substrate by removal of residue from the substrate.

Conventional photolithography can be relied upon for low-cost fabrication of imprint molds for patterns with dimensions larger than the nanoscale range, and in particular above 100 nm. However, molds with nanoscale features require the use of methods such as electron-beam lithography, which are often relatively expensive.

Currently, NIL is carried out by first imprinting a polymeric etch mask and etching a pattern onto the substrate, before subsequently patterning the substrate with metals, metal oxides, semiconductors or semiconductor oxides. This may result in an increased level of defects resulting from the use of an elaborative lithographic process.

There is a need to provide a method of preparing a substrate with dimensions in the nanoscale range, particularly 100 nm or less, that overcomes or at least ameliorates one or more of the disadvantages described above.

There is a need to provide a method to directly pattern metal and metal oxide structures, as well as semiconductor and semiconductor oxide structures, onto a substrate.

SUMMARY

According to a first aspect, there is provided method of reducing the dimension of an imprint structure on a substrate, the method comprising the steps of:

(a) providing a substrate having at least one imprint structure thereon, said structure being formed of an inorganic-organic compound comprising an inorganic moiety and a polymer moiety, said polymer moiety having a lower vaporization temperature than the melting point of said inorganic moiety; and (b) selectively removing at least part of the polymer moiety while enabling at least part of the inorganic moiety to form a substantially continuous inorganic phase in said imprint structure, wherein the removal of the at least part of the polymer moiety from the imprint structure reduces the dimension of the imprint structure.

Advantageously, the method allows for the reduction in dimension of the imprint structure to the desired dimension without the need to use molds having imprint forming features of that desired dimension. This beneficially reduces the cost of production as the cost of molds usually increases with increased resolutions of the imprint forming feature. Even more advantageously, the method allows imprint structures of inorganic material to be formed without the need for direct etching, which may unnecessarily introduce etch defects.

In one embodiment, the selectively removing step (b) comprises the step of heating said imprint structure.

In one embodiment, the inorganic moiety is bound to the polymer moiety. The inorganic moiety may be substantially homogenously dispersed throughout said polymer moiety.

In one embodiment, the polymer moiety is removed from the inorganic-organic compound by at least one of oxidation or vaporization.

In one embodiment, the method comprises the step of providing said polymer moiety being comprised of at least one of an allyl, a vinyl or an acrylate polymer. The acrylate polymer may comprise monomers of acrylates and methacrylates. Preferably, the acrylate polymer is polymethacrylate.

In one embodiment, inorganic moiety comprises at least one of a metal or metalloid. The metal may be a transition metal. The metal may be selected from the group consisting of Group 4, Group 5, Group 8, Group 10, Group 11 and Group 12 of the Periodic Table of Elements. In one embodiment, the metal is selected from the group consisting of Titanium, Zirconium, Niobium, Tantalum, Iron, Copper, Silver, and Zinc. In another embodiment, the metalloid is Silicon.

In one embodiment, the imprint structure is a generally elongate imprint having a length dimension parallel to a longitudinal axis that is generally parallel to said substrate, said length dimension being defined between a proximal end and a distal end. In another embodiment, the imprint structure is in the form of a projection having a longitudinal axis that is generally normal to said substrate and wherein the projection extends from a proximal end from said substrate to a distal end. The length dimension is at least two folds or at least three folds greater than the width dimension of the imprint.

In one embodiment, the imprint structure after said selectively removing step has substantially the same aspect ratio as the imprint before the selectively removing step. Advantageously, although the imprint size is reduced, the aspect ratio of the imprint is retained.

An array of imprints may be disposed on said substrate. In one embodiment, the array is an ordered array of a series of rows and columns of imprints being disposed on said substrate at an approximately equal distance from each other. In one embodiment, each imprint has a centre point defined along a central longitudinal axis and between said proximal and distal ends, and wherein the center point between adjacent imprints does not substantially change during said selectively removing step. Advantageously, the overall pattern of the imprint array is kept substantially the same.

In one embodiment, wherein after said selectively removing step, the dimension of the imprint reduces by at least 30% of the dimension of the imprint before said selectively removing step. In another embodiment, wherein after said selectively removing step, the dimension of the imprint reduces by 30% to 80% of the dimension of the imprint before said selectively removing step. Advantageous, the selectively removing step allows substantial reduction of the size of the imprint to occur.

In one embodiment, the providing step comprises the step of coating a monomer-composite composition comprising an admixture of a polymerizable monomeric composition and the inorganic moiety on said substrate. In one embodiment, the inorganic moiety is substantially homogenously dispersed in said polymerizable monomeric composition with little or no insolubility. Advantageously, the monomer-composite composition may be polymerised to harden and form the imprint structures, while the presence of the inorganic moiety retains the overall shape of the imprint after the selectively removing step.

In one embodiment, the method comprises the step of contacting a mold having an imprint-forming surface with said monomer-composite composition. In one embodiment, the method comprises the step of polymerizing said monomer-composite composition while in contact with said mold to form the array of imprint structures formed of said inorganic-organic compound on said substrate. The polymerization may increase the strength of the imprint structure while trapping the inorganic moiety therein. In one embodiment, the polymerizing step is undertaken at a temperature sufficient to induce free radical polymerization of the monomer-composite composition. In another embodiment, the polymerizing step is undertaken at a temperature of from 60 degree Celsius to 150 degree Celsius. In yet another embodiment, the method comprises the step of removing said mold after the temperature of said formed imprint is less than the temperature of said polymerization step. In one embodiment, the polymerizing step is carried out in the presence of ultra-violet radiation.

In one embodiment, the selectively removing comprises the step of heating said imprint. In one embodiment, the heating step is carried out at a temperature of from 300 degrees Celsius to 900 degrees Celsius. Advantageously, this ensures that substantially all of the organics present in the imprint structures are removed.

The imprint before said selectively removing step may have a dimension in micro-scale size range while the imprint after said selectively removing step has a dimension in the nanoscale size range. Advantageously, this allows nano-sized imprint structures to be produced from molds having imprint forming features of micro-sized dimensions.

In one embodiment, the substrate is composed of material selected from the group consisting of silicon, glass, metal, metal oxide, silicon dioxide, silicon nitride, Indium Tin oxide, ceramic, sapphire, and combinations thereof.

In one embodiment, the method comprises the step of providing a minimum amount of inorganic moiety in the inorganic-organic compound such that after said polymer moiety has been selectively removed, the shape of the imprint is substantially the same.

The step of providing a minimum amount of inorganic moiety in the inorganic-organic compound comprises reacting an inorganic compound with at least one of an allyl, a vinyl, a methacrylic or an acrylic acid. In one embodiment, the molar ratio of the inorganic compound and the at least one of an allyl, a vinyl, a methacrylic or an acrylic acid, is dependent on the oxidation state of the inorganic compound. In one embodiment, the inorganic compound and the at least one of an allyl, a vinyl, a methacrylic or an acrylic acid are reacted in a molar ratio of about 1:8 to about 1:2. Advantageously, this allows the imprint structure to maintain its overall integrity after said selectively removing step. The inorganic compound may be at least one of a metal alkoxide or a metalloid alkoxide.

According to a second aspect, there is provided a substrate comprising nano- or micro-sized inorganic structures thereon obtained by the method as disclosed herein.

According to a third aspect, there is provided the use of an imprinted substrate in one of: (i) a semiconductor device; (ii) nanoimprint mold fabrication; (iii) an anti-microbial coating; (iv) solar cells; (v) sensors; (vi) displays; (vii) bit-pattern media; and (viii) ferro-electric random access memory, wherein said imprinted substrate is made in a method as defined herein.

Definitions

The following words and terms used herein shall have the meaning indicated:

The term "imprint" and grammatical variations thereof, in the context of this specification, is intended to cover any form of physical structure that has been made by a mold. Typically, an imprint is a generally elongate structure that extends from the surface of a substrate along a longitudinal axis extending between a proximal end disposed on or adjacent to the substrate and a distal end opposite to the proximal end. Typically, the longitudinal axis is generally normal relative to a planar axis of the substrate although the longitudinal axis may be generally parallel relative to a planar axis of the substrate or may be varied significantly such as at an angle of 45° from a planar axis of the substrate. In an array of imprints that have been orderly formed as a series of rows and columns on a substrate, trenches may be formed between the adjacent rows. The imprint may be in the nanoscale or micro-scale size range both in their length dimension and thickness dimension, and hence the trenches may also be in the nanoscale or micro-scale size range.

The term "bind", "bound" or grammatical variants thereof as used herein, refers to the interaction between a corresponding pair of molecules which may be physical or chemical.

The term "nanoimprinting" is to be interpreted broadly to include any method for printing or creating a pattern or structure on the microscale and/or nanoscale size range on the surface of a substrate by contacting a mold with the defined pattern or structure on the surface at certain temperatures and pressures.

The terms "micro-sized", "microscale" or the like are to be interpreted to include any dimensions that are in the range of about 1 ($\mu$m) to about 100 $\mu$m. The term "microstructures" as used herein, refers to imprint structures comprising "micro-sized" or "microscale" features.

The terms "nano-sized", "nanoscale" or the like are to be interpreted to include any dimensions that are below about 1 $\mu$m. The term "nanostructures" as used herein, are imprint structures comprising "nano-sized" or "nanoscale" or "sub-micron" features.

The term "Spin-coating" as used herein generally refers to a process wherein a polymer solution is dispersed on a surface (e.g., a mold) and the surface is rapidly spun centrifugally forcing the solution to spread out and forming a thin layer of de-solvated polymer in the process.

The term "mold" disclosed herein generally refers to a mold structure or a master mold that is used for shaping or fabrication of a specific article or product.

The term "polymer" as used herein denotes a molecule having two or more units derived from the same monomer component, so that the "polymer" incorporates molecules derived from different monomer components to form copolymers, terpolymers, multi-component polymers, graft-copolymers, block-co-polymers, and the like. The term "surface pattern" as used herein generally refers to an outer peripheral surface of any structure disclosed herein.

The term "vaporization temperature" when used to describe a property of a substance refers to the temperature at which that substance changes from either a solid phase directly to a vapor phase or liquid phase to a vapor phase or both, at a given pressure.

The word "substantially" does not exclude "completely" e.g. a composition which is "substantially free" from Y may be completely free from Y. Where necessary, the word "substantially" may be omitted from the definition of the invention.

Unless specified otherwise, the terms "comprising" and "comprise", and grammatical variants thereof, are intended to represent "open" or "inclusive" language such that they include recited elements but also permit inclusion of additional, unrecited elements.

As used herein, the term "about", in the context of concentrations of components of the formulations, typically means +/−50 of the stated value, more typically +/−40 of the stated value, more typically +/−30 of the stated value, more typically, +/−20 of the stated value, even more typically +/−10 of the stated value, and even more typically +/−0.50 of the stated value.

Throughout this disclosure, certain embodiments may be disclosed in a range format. It should be understood that the description in range format is merely for convenience and brevity and should not be construed as an inflexible limitation on the scope of the disclosed ranges. Accordingly, the description of a range should be considered to have specifically disclosed all the possible sub-ranges as well as individual numerical values within that range. For example, description of a range such as from 1 to 6 should be considered to have specifically disclosed sub-ranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

DETAILED DISCLOSURE OF EMBODIMENTS

Exemplary, non-limiting embodiments of a method of reducing the dimension of an imprint structure on a substrate, will now be disclosed.

The method comprising the steps of (a) providing a substrate having the imprint structure thereon, said structure being formed of a inorganic-organic compound comprising an inorganic moiety and a polymer moiety, said polymer moiety having a lower vaporization temperature than the melting point of said inorganic moiety; and (b) selectively removing at least part of the polymer moiety while enabling at least part of the inorganic moiety to form a substantially continuous inorganic phase in said imprint structure, wherein the removal of the at least part of the polymer moiety from the imprint structure reduces the dimension of the imprint structure. The selectively removing step may be a heating step and may remove the polymer by at least one of oxidation or vaporization. The selectively removing step may be carried out at a temperature of from about 200 degrees Celsius to about 1000 degrees Celsius, about 300 degrees Celsius to about 900 degrees Celsius, about 300 degrees Celsius to about 800 degrees Celsius, about 300 degrees Celsius to about 700 degrees Celsius, about 300 degrees Celsius to about 600 degrees Celsius, about 300 degrees Celsius to about 500 degrees Celsius. In one embodiment, the heating step is carried out at about 350 to 450 degrees Celsius and in one embodiment about 400 degrees Celsius.

The disclosed method may comprise the step of coating a monomer-composite composition comprising an admixture of a polymerizable monomeric composition and the inorganic moiety on said substrate. The coating step may be carried out by at least one of the methods selected from the group consisting of spin coating, dip coating and vapor deposition.

The disclosed method may also comprise the step of contacting a mold having an imprint-forming surface with said monomer-composite composition. The contacting step may comprise contacting the mold at a pressure of from about 500 kPa to about 8000 kPa, from about 800 kPa to about 6000 kPa or from about 1000 kPa to about 5000 kPa. The contacting step may occur from about 25 seconds to about 1500 seconds, from about 50 seconds to about 1200 seconds or from about 70 seconds to about 1000 seconds. The contacting step may also be carried out at room temperature.

The disclosed method may also comprise the step of polymerizing said monomer-composite composition while in contact with said mold to form the array of imprint structures formed of said inorganic-organic compound on said substrate. In one embodiment, the polymerizing step is undertaken at a temperature sufficient to induce free radical polymerization of the monomer-composite composition. In another embodiment, polymerizing step is undertaken at a temperature of from about 50 degrees Celsius to about 200 degrees Celsius, from about 60 degrees Celsius to about 150 degrees Celsius, from about 80 degrees Celsius to about 120 degrees Celsius, from about 100 degrees Celsius to about 110 degrees Celsius. The method may also comprise the step of removing said mold after the temperature of said formed imprint is less than the temperature of the polymerization step.

In one embodiment, the method comprises the step of providing a minimum amount of inorganic moiety in the inorganic-organic compound such that after said polymer moiety has been selectively removed, the shape of the imprint is substantially the same. The step of providing a minimum amount of inorganic moiety in the inorganic-organic compound may comprise reacting an inorganic compound with an organic acid in a molar ratio of about 1:8 to about 1:2. The inorganic compound may be at least one of a metal alkoxide or a metalloid alkoxide. The organic acid may be selected from the group consisting of an allyl acid, a vinyl acid, a methacrylic acid and an acrylic acid.

Polymer Moiety

In one embodiment, the polymer moiety is being comprised of a polymer selected from the group consisting of an allyl polymer, a vinyl polymer and an acrylate polymer. Exemplary vinyl or allyl polymers include, but are not limited to, polyvinylalcohol, polyallylalcohol, and vinyl ether copolymers. Exemplary acrylate polymers include, but are not limited to, polymers of ethyl acrylate, polymers of methyl methacrylates, polymers of methacrylates, copolymers of ethyl acrylate and methyl methacrylate, and methacrylate copolymers with trimethylammonio-ethylmethacrylate In one embodiment, the acrylate polymer is selected from the group consisting of homopolymers and heteropolymers comprising monomers of acrylates and methacrylates of methyl, ethyl, n-propyl, isopropyl, n-butyl, isobutyl, tert-butyl, allyl, cyclohexyl, dihydrodicyclopentadienyl, trimethylammonio-ethyl, 2-allyloxyethyl, 3- and 4-vinylbenzyl and 2-ethylhexyl.

In one particular embodiment, the polymer may comprise polymethacrylate.

Monomers

In one embodiment, the method may further include the step of cross-linking functional monomers to form at least one of allyl, vinyl or acrylate polymers. The cross-linked polymers enhance the strength of the formed imprints. Exemplary functional monomers that form the acrylate polymer include acrylates and methacrylates and combinations thereof. In one embodiment, the monomer that forms the acrylate polymer is a methacrylate. In another embodiment, the methacrylate monomer is selected from the group consisting of Titanium methacrylate, Zirconium methacrylate, Niobium methacrylate, Tantalum methacrylate, Iron methacrylate, Copper methacrylate, Silver methacrylate, Zinc methacrylate and Silicon methacrylate.

Crosslinker

The polymer moiety may also be formed in the presence of cross-linkers that lend rigidity to the imprint structure and may be selected from the group consisting of di-, tri- and tetrafunctional acrylates or methacrylates, divinylbenzene (DVB), alkylene glycol and polyalkylene glycol diacrylates and methacrylates, including ethylene glycol dimethacrylate (EDMA) and ethylene glycol diacrylate, vinyl or allyl acrylates or methacrylates, divinylbenzene, diallyldiglycol dicarbonate, diallyl maleate, diallyl fumarate, diallyl itaconate, vinyl esters such as divinyl oxalate, divinyl malonate, diallyl succinate, triallyl isocyanurate, the dimethacrylates or diacrylates of bis-phenol A or ethoxylated bis-phenol A, methylene or polymethylene bisacrylamide or bismethacrylamide, including hexamethylene bisacrylamide or hexamethylene bismethacrylamide, di(alkene) tertiary amines, trimethylol propane triacrylate, pentaerythritol tetraacrylate, divinyl ether, divinyl sulfone, diallyl phthalate, triallyl melamine, 2-isocyanatoethyl methacrylate, 2-isocyanatoethylacrylate, 3-isocyanatopropylacrylate, 1-methy: L-2-isocyanatoethyl methacrylate, 1,1-dimethyl-2-isocyanaotoethyl acrylate, tetraethylene glycol diacrylate, tetraethylene glycol dimethacrylate, triethylene glycol diacrylate, triethylene glycol dimethacrylate, hexanediol dimethacrylate, and hexanediol diacrylate. In one embodiment, the crosslinker is ethylene glycol dimethacrylate (EDMA).

In one embodiment, the cross-linkers may be selected in an amount to ensure that a substantially smooth film is obtained during spin-coating as well as to ensure the shape of the imprint is retained after said polymer moiety has been selectively removed for example after said heating step.

The amount of cross-linkers to functional monomer by weight may in the range of about 0.5% to about 50.

Free Radical Initiator

The polymer moiety may also be formed by free radical polymerization in the presence of free radical initiators. The free radical initiator may be an ultra-violet (UV) or thermal free radical initiator. Exemplary free radical initiators may be selected from the group consisting of benzoyl peroxide, acetyl peroxide, lauryl peroxide, azobisisobutyronitrile, t-butyl peracetate, cumyl peroxide, t-butyl peroxide, t-butyl hydroperoxide, bis(isopropyl)peroxy-dicarbonate, benzoin methyl ether, 2,2'-azobis (2,4-dimethylvaleronitrile), tertiarybutyl peroctoate, phthalic peroxide, diethoxyacetophenone, and tertiarybutyl peroxypivalate, diethoxyacetophenone, 1-hydroxycyclohexyl phenyl ketone, 2,2-dimethyoxy-2-phenylacetophenone, and phenothiazine, and diisopropylxanthogen disulfide. In one embodiment, the free radical initiator is azobis-isobutyronitrile.

The choice of monomer, co-monomer and cross-linkers may be determined by the chemical and physical properties of the desired resultant polymer for imprinting.

Inorganic Moiety

The inorganic moiety may comprise a metal or a metalloid. In one embodiment, the metal is a transition metal. The metal may also be selected from the group consisting of Group 4, Group 5, Group 8, Group 10, Group 11 and Group 12 of the Periodic Table of Elements. In one embodiment, the metal is selected from the group consisting of Titanium, Zirconium, Niobium, Tantalum, Iron, Copper, Silver, and Zinc. In another embodiment, the inorganic moiety is a metalloid selected from the group consisting of Boron, Silicon, Germanium, Arsenic and Antimony.

Imprint Structure

In one embodiment, the imprint structure is a generally elongate imprint having a length dimension parallel to a longitudinal axis that is generally parallel to said substrate, said length dimension being defined between a proximal end and a distal end. In another embodiment, the imprint structure is in the form of a projection having a longitudinal axis that is generally normal to said substrate and wherein the projection extends from a proximal end from said substrate to a distal end. The imprint structure may be a spatially distinct imprint structure. In one embodiment, an array of imprint structures is provided. The array may be an ordered array of a series of rows and columns of imprints being disposed on said substrate at an approximately equal distance from each other.

The imprint structures may be either connected with each other or isolated from each other. The imprint structures may have shapes that are selected from the group consisting of holes, columns, pillars, dimples, projections, gratings or trenches. The imprint structures may have defined heights, widths or lengths that are in the microscale or in the nanoscale. In one embodiment, prior to the selectively removing step, at least one of the heights, widths, lengths and diameter (if applicable) of said imprint structures are in the range of from about 50 nm to about 5 microns. The at least one of the heights, widths, lengths and diameter (if applicable) of said imprint structures before said selectively removing step may depend on the mold used. In another embodiment, after the selectively removing step, at least one of the heights, widths, lengths and diameter (if applicable) of said imprint structures are in the range of from about 10 nm to about 1 micron. In one embodiment, the imprint before said selectively removing step may have a dimension in the micro-scale size range while the imprint after said selectively removing step has a dimension in the nanoscale size range. In one embodiment, the imprint structure after said selectively removing step has substantially the same aspect ratio as the imprint before the selectively removing step. The length dimension may be at least two folds or at least three folds greater than the width dimension of the imprint. The imprint structures may be in a spaced apart relationship from each other. In one embodiment, each imprint may have a centre point defined along a central longitudinal axis and between said proximal and distal ends, and the center point between adjacent imprints does not substantially change during said selectively removing step. In one embodiment, after said selectively removing step, the dimension of the imprint reduces by at least 30% of the dimension of the imprint before said selectively removing step. After said selectively removing step, the dimension of the imprint may reduce by 30% to 80% of the dimension of the imprint before said selectively removing step.

Substrate

The substrate may be comprised of an organic material, such as a polymer, or an inorganic material, such as silicon. The substrate may be planar or non-planar. Exemplary substrate materials include silicon, glass, quartz, mica, ceramics, polymers such as polyethylene, polypropylene, polyesters such as polyethylene terephthalate, polybutylene terephthalate, polyamides, fluoropolymers and polysulphone and metals such as gold, silver, copper. In one embodiment, the substrate is composed of material selected from the group consisting of silicon, glass, metal, metal oxide, silicon dioxide, silicon nitride, Indium Tin oxide, ceramic, sapphire, polymers and combinations thereof.

Mold

The mold may have a defined surface to create three-dimensional imprint structures during said contacting step. The three-dimensional imprint structures may be dimensioned in at least one of the microscale and the nanoscale. The mold may have a solid body with an array of conduits extending through the solid body. The mold may be made of any suitable material that is chemically inert. The mold may be made from a material selected from the group consisting of silicon, metal, glass, quartz and ceramic. In one embodiment, the mold may be made of silicon nitride. The mold may have an imprint forming surface provided thereon and may be patterned. The patterns may comprise holes, columns, pillars, dimples, projections, gratings or trenches. The patterns may have defined heights, widths or lengths that are in the microscale or in the nanoscale. The patterns may be in a spaced apart relationship from each other. The patterns may be three-dimensional structures.

In one embodiment, the patterns on the mold may comprise gratings and/or trenches. The gratings and/or trenches may extend along respective longitudinal axes of the mold. The width of the gratings and/or trenches may be in the microscale or nanoscale. When both gratings and trenches are present on the mold, the gratings and trenches may be placed parallel to each other. The patterns on the mold may also comprise line and space patterns. The width of the gratings and/or trenches may be independently selected from the group consisting of about 50 nm to about 50 microns, about 50 nm to about 30 microns, about 50 nm microns to about 20 microns, about 80 nm to about 10 microns, about 80 nm to about 5 microns, about 90 nm to about 1 microns, about 100 nm to about 500 nm, about 100 nm to about 400 nm and about 50 nm to about 250 nm. In one embodiment, the width of the gratings and corresponding channels may be about 10 microns. The grating formation may have a shape, when viewed in cross-section, selected from the group consisting of sinusoidal wave shape, square wave, trapezoidal shape, blazed shape and triangular shape.

The gratings and/or trenches may have an aspect ratio selected from the group consisting of about 0.1 to about 3.0, about 0.1 to about 2.5, about 0.1 to about 2.0, about 0.1 to about 1.5, about 0.1 to about 1.0, and about 0.1 to about 0.5.

In another embodiment, the patterns on the mold may comprise columns and/or circular holes. The diameter of the columns and/or circular holes may be in the micro-scale. The patterns on the mold may also comprise pillars and/or dimples.

The diameter of the columns and/or circular holes may be independently selected from the group consisting of about 100 nm to about 10 microns, about 100 nm to about 8 microns, about 100 nm to about 6 microns, about 100 nm to about 4 microns, about 100 nm to about 2 microns, about 100 nm to about 10 microns, about 500 nm to about 10 microns, about 100 nm to about 500 nm, about 100 nm to about 400 nm and about 150 nm to about 250 nm.

The columns, pillars, dimples and/or circular holes may have an aspect ratio selected from the group consisting of about 0.1 to about 3.0, about 0.1 to about 2.5, about 0.1 to about 2.0, and about 0.1 to about 1.5.

The patterns may be formed on the mold by a method selected from the group consisting of photolithography, deep reactive ion etching, holographic lithography, e-beam lithography, ion-beam lithography and combinations thereof.

Anti-Stiction Agent

The method may further comprise the step of applying an anti-stiction agent onto the defined surface pattern of the mold to reduce the surface energy and to enhance subsequent mold release. Exemplary anti-stiction agents may be selected from the group consisting of diamond, diamond-like carbon, silicon carbide, vapor phase deposited fluorinated polymer, a self-assembled monolayer comprising silane coupling agents such as dichlorodimethylsilane, octadecyltrichlosilane, dodecyltrichlorosilane, or perfluorodecyltrichlorosilane, and alkanethiols. In one embodiment, the anti-stiction agent is perfluorodecyltrichlorosilane.

Cleaning Step

The method may further comprise the step of cleaning the surface of the substrate before coating with the monomer-composite composition. The step of cleaning may comprise applying a cleaning solution such as a piranha solution to the substrate. In another embodiment, the cleaning step comprises applying a plasma gas onto the surface of the substrate to which the imprints adhere. The plasma gas may be applied as a cleaning agent of the surface of the substrate to aide in adhesion to the polymerised composition. Exemplary gasses that may be used include oxygen, halides such as fluorine and chlorine and noble gasses such as argon and mixtures thereof.

Coupling Step

The method may further comprise the step of applying a coupling agent to assist in adhering the imprints to the substrate. The coupling agent may be a silane-based coupling agent. The choice of silane coupling depends on the chemistry of the substrate and the imprinted polymer. Exemplary silane-based coupling agents may be selected from the list consisting of methyltrimethoxysilane, ethyltrimethoxysilane, propyltrimethoxysilane, butyltrimethoxysilane, dimethyldimethoxysilane, diethyldimethoxysilane, vinyltriethoxysilane, vinyltrimethoxysilane, trimethylmethoxysilane, triethylmethoxysilane, vinyltris (methoxyethoxy) silane, trimethylchlorosilane, trimethylaminosilane, glycidoxypropyltrimethoxysilane, glycidoxypropylmethyldiethoxysilane, (epoxycyclohexyl)ethyltrimethoxysilane, methacryloxypropyltrimethoxysilane, methacryloxypropyltriethoxysilane, divinyldimethoxysilane and chloropropyltrimethoxysilane, triethoxysilane, vinyltris (β-methoxyethoxy)silane, γ-methacryloxypropyltrimethoxysilane, γ-glycidoxypropyltrimethoxysilane, β-(1,1-epoxycyclohexyl)ethyltrimethoxysilane, n-β-(aminoethyl)-γ-aminopropyltrimethoxysilane, N-β-(aminoethyl)~γ-aminopropylmethyldimethoxysilane, γ~aminopropyltriethoxysilane, N-phenyl-γ-aminopropyltrimethoxysilane, mercaptopropyltrimethoxysilane, γ~chloropropyltrimethoxysilane, γ~aminopropyltrimethoxysilane, γ-aminopropyl-tris (2-methoxy-ethoxy)silane, N-methyl-γ-aminopropyltrimethoxysilane, N-vinylbenzyl-γ-aminopropyltriethoxysilane, triaminopropyltrimethoxysilane, 3-ureidopropyltrimethoxysilane, 3-4,5-dihydroimidazolepropyltriethoxysilane, hexamethyldisilazane, N,O-(bistrimethylsilyl)amide and N,N-bis(trimethylsilyl)urea; aminosilane, epoxysilanes, phenethylmethyldichlorosilane, divinyldichlorosilane and trivinylmethoxysilane. Exemplary aminosilane and epoxysilanes are γ-aminopropyltriethoxysilane, N-β-(aminoethyl)-γ-aminopropyltriethoxysilane, γ-glycidoxypropyltrimethoxysilane, and β-(3,4-epoxycyclohexyl)ethyltrimethoxysilane.

Polymerisation Step

The polymerising step may be controlled according to one or more controlled conditions selected from the group of pressure, temperature and time. The pressure condition during the polymerisation step may be in the range selected from the group consisting: about 1 MPa to about 10 MPa; about 1 MPa to about 5 MPa; and about 1.5 MPa to about 4 MPa. The temperature condition during the polymerisation step may be in the range selected from the group consisting: about 50 degrees Celsius to about 200 degrees Celsius, about 60 degrees Celsius to about 150 degrees, about 100 degrees Celsius to about 150 degrees and about 100 degrees Celsius to 120 degrees.

In one embodiment, the polymerisation step is carried out at about 110 degrees Celsius.

The time condition during the polymerisation step may be in the range selected from the group consisting of: about 30 seconds to about 1500 seconds; about 50 seconds to about 1200 seconds; and about 70 seconds to about 1000 seconds. In one embodiment, the time condition during the polymerisation step is 180 seconds.

The method may comprise the further step of allowing the formed one or more polymer imprints to cool to a mold release temperature range before releasing the removing step. The mold release temperature may be in the range selected from the group consisting of: about 20 degrees Celsius to 150 degrees Celsius; about 40 degrees Celsius to 120 degrees Celsius; and about 50 degrees Celsius to 100 degrees Celsius. In one embodiment, the mold release temperature is no more than about 60 degrees Celsius. In one embodiment, the polymerising step may comprise radiating the monomer-composite composition with radiation. The radiation may be ultraviolet light having a wavelength in the range of about 5 to 400 nanometers.

Residue Removing Step

The method may comprise the further step of removing residue from the formed one or more polymer imprints. The removing residue step may comprise etching using a plasma gas. Exemplary gasses that may be used include oxygen, halides such as fluorine and chlorine and noble gasses such as argon and mixtures thereof. In one embodiment, the etching is carried out using oxygen or argon. The method may comprise the use of nanoimprinting lithography. The method may form imprint structures with high patterning yield and may be highly reproducible.

BRIEF DESCRIPTION OF DRAWINGS

The accompanying drawings illustrate a disclosed embodiment and serves to explain the principles of the disclosed embodiment. It is to be understood, however, that the drawings are designed for purposes of illustration only, and not as a definition of the limits of the invention.

FIG. 3a is a scanning electron microscope (SEM) image at 30,000× magnification of the substrate as shown in FIG. 2a.

FIG. 3b is a scanning electron microscope (SEM) image at 30,000× magnification of the substrate as shown in FIG. 2b.

FIG. 5a is a scanning electron microscope (SEM) image at 30,000× magnification of the substrate as shown in FIG. 4a.

FIG. 7a(i) is a scanning electron microscope (SEM) image at 10,000× magnification of a substrate according to one embodiment of the disclosed method, with linear imprint structures of about 100 nm line width comprising polymerized Zirconium methacrylate.

FIG. 7a(ii) is a scanning electron microscope (SEM) image at 30,000× magnification of the substrate as shown in FIG. 7a(i).

FIG. 7b(i) is a scanning electron microscope (SEM) image at 10,000× magnification of the substrate as shown in FIG. 7a(i), after heat-treatment.

FIG. 7b(ii) is a scanning electron microscope (SEM) image at 30,000× magnification of the substrate as shown in FIG. 7b(i).

FIG. 8a(i) is a scanning electron microscope (SEM) image at 10,000× magnification of a substrate according to one embodiment of the disclosed method, with linear imprint structures of about 100 nm line width comprising polymerized Niobium methacrylate.

FIG. 8a(ii) is a scanning electron microscope (SEM) image at 30,000× magnification of the substrate as shown in FIG. 8a(i).

FIG. 8b(i) is a scanning electron microscope (SEM) image at 10,000× magnification of the substrate as shown in FIG. 8a(i), after heat-treatment.

FIG. 8b(ii) is a scanning electron microscope (SEM) image at 30,000× magnification of the substrate as shown in FIG. 8b(i).

FIG. 9a(i) is a scanning electron microscope (SEM) image at 10,000× magnification of a substrate according to one embodiment of the disclosed method, with linear imprint structures of about 100 nm line width comprising polymerized Tantalum methacrylate.

FIG. 9a(ii) is a scanning electron microscope (SEM) image at 30,000× magnification of the substrate as shown in FIG. 9a(i).

FIG. 9b(i) is a scanning electron microscope (SEM) image at 10,000× magnification of the substrate as shown in FIG. 9a(i), after heat-treatment.

FIG. 9b(ii) is a scanning electron microscope (SEM) image at 30,000× magnification of the substrate as shown in FIG. 9b(i).

FIG. 10a(i) is a scanning electron microscope (SEM) image at 10,000× magnification of a substrate according to one embodiment of the disclosed method, with linear imprint structures of about 100 nm line width comprising polymerized Iron methacrylate.

FIG. 10a(ii) is a scanning electron microscope (SEM) image at 30,000× magnification of the substrate as shown in FIG. 10a(i).

FIG. 10b(i) is a scanning electron microscope (SEM) image at 10,000× magnification of the substrate as shown in FIG. 10a(i), after heat-treatment.

FIG. 10b(ii) is a scanning electron microscope (SEM) image at 30,000× magnification of the substrate as shown in FIG. 10b(i).

FIG. 11a(i) is a scanning electron microscope (SEM) image at 10,000× magnification of a substrate according to one embodiment of the disclosed method, with linear imprint structures of about 100 nm line width comprising polymerized Silicon methacrylate.

FIG. 11a(ii) is a scanning electron microscope (SEM) image at 30,000× magnification of the substrate as shown in FIG. 11a(i).

FIG. 11b(i) is a scanning electron microscope (SEM) image at 10,000× magnification of the substrate as shown in FIG. 11a(i), after heat-treatment.

FIG. 11b(ii) is a scanning electron microscope (SEM) image at 30,000× magnification of the substrate as shown in FIG. 11b(i).

EXAMPLE

Figure 1:
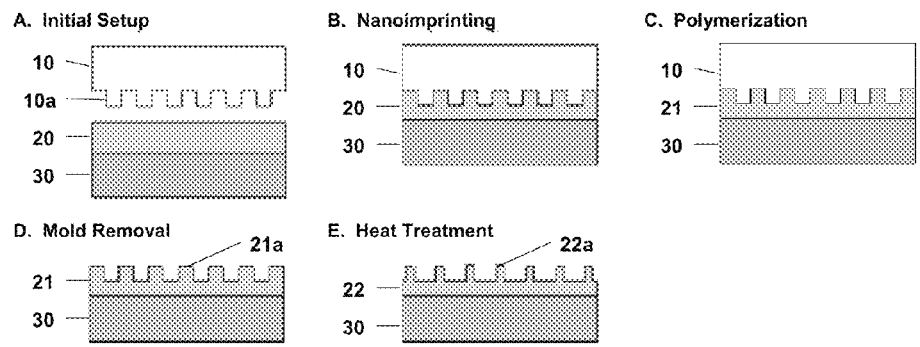
FIG. 1 is a schematic diagram illustrating the method in accordance to one embodiment of the disclosed method.

Non-limiting examples of the invention will be further described in greater detail by reference to specific Examples, which should not be construed as in any way limiting the scope of the invention.

Without being bound by theory, it is believed that the current invention proceeds via the following reaction pathway, wherein Titanium methacrylate monomer is polymerized to form imprint structures comprising a polymethacrylate polymer moiety in which Titanium is evenly distributed. Said imprint structures are subsequently treated with heat to substantially remove the polymer moiety, leaving imprint structures of reduced dimensions in which Titanium and its oxides form a substantially continuous phase.

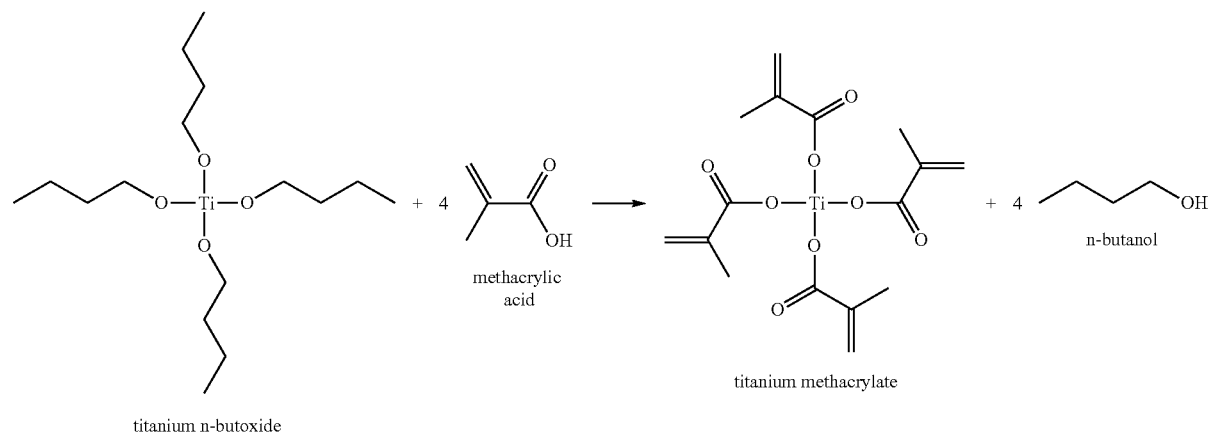

Nanoimprinting lithography, 10 bars, 110 C.
(free radical polymerization, crosslinking)

↓ Heat-treatment

Imprinting TiO₂ (anatase)

A) Metal Methacylate Synthesis

TiMA is prepared by reacting Titanium n-butoxide (Ti(OBu″)₄) and methacrylic acid (MAA) in a ratio of molar ratio of 1:4. Ti(OBu″)₄, MAA and ethylene glycol dimethacrylate (EDMA) are procured from a supplier such as Aldrich. Ti(OBu″)₄ and MAA are used without further purification, while EDMA is first passed through an alumina column in order to remove any stabilizers. Next, Ti(OBu″)₄, MAA and EDMA are mixed together (molar ratio of Ti(OBu″)₄:MAA:EDMA=1:4:2). A red solution results. After mixing, azobis(isobutyronitrile) (AIBN) is added in the amount of 2 wt % of MAA and EDMA. This mixture is termed an "imprintable TiMA-EDMA mixture."

B) Metal Methacrylate Imprinting

Prior to imprinting, silicon substrates and molds are cleaned, mold treatment is performed and films formed using spin coating. The full procedure is as follows.

First, silicon substrates are cleaned with piranha solution at 140° C. for 2 hours, followed by rinsing with deionized water and blow drying by nitrogen air gun. The substrates are placed in a drying oven to remove any remaining moisture on the surface. The dimension of substrates used is 1 cm×1 cm.

Second, three types of standard silicon molds with different patterns are prepared for use. The first two are grating molds with line widths of 250 nm and 100 nm, generating line and space imprint patterns. The third is a dimple mold that generates a pillar and line pattern with pillars of 200 nm diameter by 100 nm height. The molds are treated in oxygen plasma (100RF, 200 torr) for 10 min. After plasma treatment, the mold is cleaned by piranha solution at 140° C. for 2 hours, followed by rinsing with deionized water and blow drying by nitrogen air gun. They are placed in a drying oven to remove any remaining moisture on the surface. A 20 mM solution of perfluorodecyltrichlorosilane (FDTS) in a vacuum desiccator was used to silanize the molds for 5 hours. The silanization treatment is used to reduce the surface energy of the molds to facilitate the demolding process.

Third, a uniform film of the imprintable TiMA-EDMA mixture is coated onto the substrate by spin-coating of the liquid TiMA-EDMA mixture at 800 rpm for 30 seconds.

Finally, the imprintable TiMA-EDMA film on the substrate is imprinted with the mold. The imprinting system used is a pressure chamber with isotropic pressure, which allows pressing force to be delivered to a large area substrate effectively and uniformly. This process was carried out in an Obducat imprinter (Obducat, Sweden). The imprinting was carried out in two steps—the mold is initially brought into contact with the imprintable TiMA-EDMA film for 300 secs at a temperature of 30° C. and a pressure of 10 bars. Subsequently, without releasing the pressure, the film and the mold are heated to 110° C. for 180 secs in order to induce polymerization. Thereafter, it is cooled down to 20° C. before the pressure is released and the mold removed.

Following a clean demolding, imprinting yield of >90% was observed. The imprinted substrate is then heat treated at a temperature of 400° C. in a furnace in air. The results were analyzed by a scanning electron microscope (SEM) as shown in FIG. 2 through 6 described in more detail further below.

Upon further examination of the cross section by atomic force microscopy, it was found that both the polymerization step and the heat-treatment step caused shrinkage in feature sizes. The heat-treatment step caused feature shrinkage of between 33% and 74% relative to the imprint structures before heat-treatment, as summarized in the following table.

TABLE 1

Summary of the approximate feature size reduction at every step of the TiO₂ patterning using imprint lithography

| Mold shape/size | Feature size of the imprint after free redical polymerization | | Oxide feature size after the heat-treatment of imprinted structures | | Total feature size reduction with respect to mold features size (%) |
| --- | --- | --- | --- | --- | --- |
| | Width of imprint (nm) | Feature size reduction (%) | Width of the oxide feature (nm) | Feature size reduction (%) | |
| Dimples, 200 nm | 120 | 40% | 80 | 33% | 60% |
| Lines, 250 nm | 230 | 8% | 60 | 74% | 76% |
| Lines, 100 nm | 70 | 30% | 20 | 72% | 80% |

DETAILED DESCRIPTION OF DRAWINGS

Referring to FIG. 1, there is provided a schematic diagram illustrating the method in accordance to one embodiment of the disclosed method. In step D, a silicon substrate 30 is provided having at least one imprint structure 21a which is part of an array of one or more imprint structures 21.

The array of imprint structures is formed by steps A through C, from a silicon substrate 30 in step A, initially spin coated with a layer 20 of a monomer-composite composition comprising an admixture of a titanium methacrylate, ethylene glycol dimethacrylate (crosslinker), azobis-isobutyronitrile (initiator). In step B, a silicon or a quartz mold 10 with an imprint-forming surface 10a is contacted with layer 20 under pressure of 1000 kPa for 300 seconds, such that the monomer-composite composition takes the shape of the mold 10 in layer 20. In step C, the assembly of 10, 20 and 30 are brought to a temperature of 110° C. for 180 seconds such that layer 20 undergoes polymerization to form said array of imprint structures 21.

At this point, referring to step D, the mold 10 is removed, leaving substrate 30 with one or more imprint structures thereon, said imprint structures 21 comprising a titanium component dispersed in a polymethacrylate polymer moiety. In step E, imprint structures 21 are heat-treated at 400° C. in a furnace in air to selectively remove the organic matter from the polymethacrylate polymer moiety by oxidation and vaporization, while leaving behind titanium oxide in imprint structures of reduced size, 22. Individual imprint structures 22a are now reduced in dimension relative to imprint structures before heat-treatment, 21a.

Figures 2A, 2B:
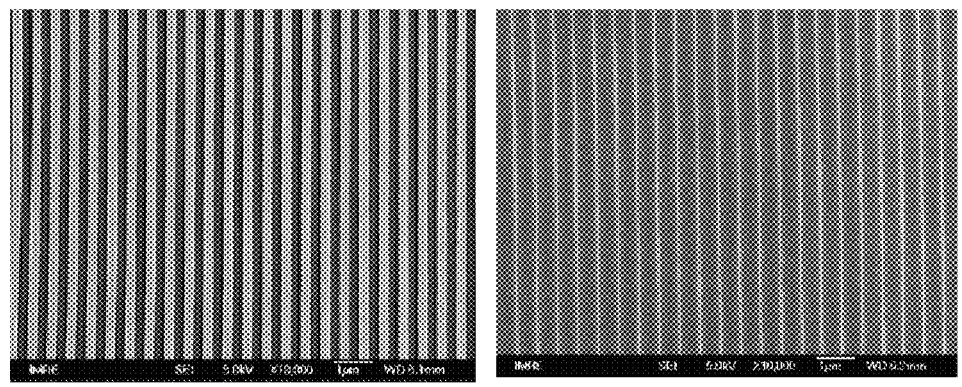
FIG. 2a is a scanning electron microscope (SEM) image at 10,000× magnification of a substrate according to one embodiment of the disclosed method, with linear imprint structures of about 250 nm line width comprising polymerized Titanium methacrylate, before heat-treatment.
FIG. 2b is a scanning electron microscope (SEM) image at 10,000× magnification of the substrate as shown in FIG. 2a, after heat-treatment.

Referring to FIGS. 2a and 2b, there are provided scanning electron microscope (SEM) images at 10,000× magnification of a substrate comprising polymerized Titanium methacrylate and having linear imprint structures with line widths of about 250 nm in accordance to one embodiment of the disclosed method, before and after heat-treatment respectively. Significant shrinkage in feature dimensions can be seen, from line widths of about 250 nm before heat-treatment, to reduced line widths of about 70 nm after heat-treatment. It will also be noted from the images in FIG. 2a and FIG. 2b that the shape of the imprints before and after the heat-treatment step remained substantially the same.

Figures 3A, 3B:
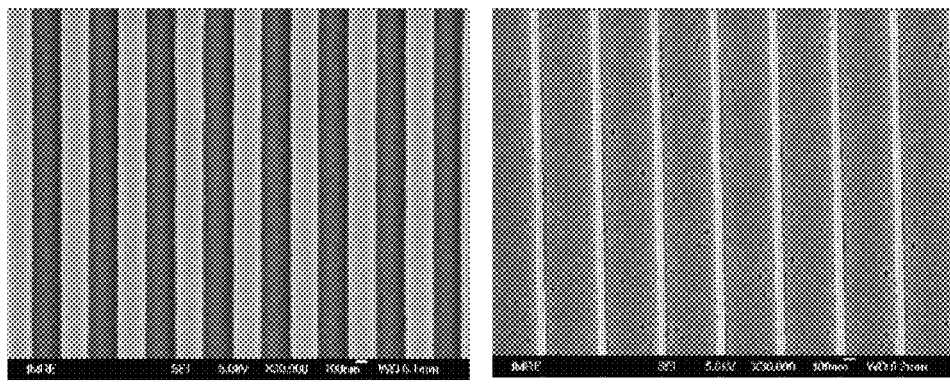

Referring to FIGS. 3a and 3b there are provided scanning electron microscope (SEM) images at 30,000× magnification of the substrate of FIG. 2a and FIG. 2b respectively. Significant shrinkage in feature dimensions can be seen, from line widths of about 250 nm before heat-treatment, to reduced line widths of about 70 nm after heat-treatment. Furthermore, it can also be seen that the center point between adjacent imprint structures does not change substantially after said heat-treatment. That is, it can be seen from the images in FIG. 3a and FIG. 3b that the shape of the imprints before and after the heat-treatment step remained substantially the same. Also, the center to center distances between adjacent structures do not substantially change.

Figure 4A:
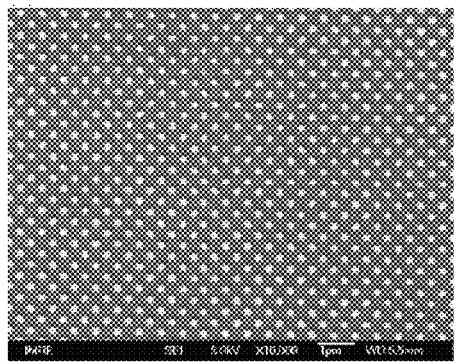
FIG. 4a is a scanning electron microscope (SEM) image at 10,000× magnification of a substrate according to one embodiment of the disclosed method, with columnar imprint structures of about 200 nm diameter comprising polymerized Titanium methacrylate, before heat-treatment.
Figure 4B:
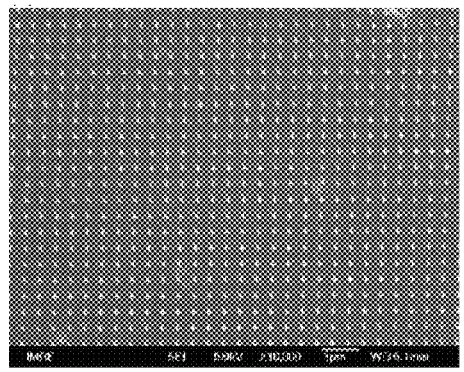
FIG. 4b is a scanning electron microscope (SEM) image at 10,000× magnification of the substrate as shown in FIG. 4a, after heat-treatment.

Referring to FIG. 4a and FIG. 4b there are provided scanning electron microscope (SEM) images at 10,000× magnification of a substrate comprising polymerized Titanium methacrylate and having columnar imprint structures with columnar diameters of 200 nm in accordance with one embodiment of the disclosed method, before and after heat-treatment respectively. Significant shrinkage in feature dimensions can be seen, from columnar diameters of about 200 nm before heat-treatment, to reduced columnar diameters of about 70 nm after heat-treatment.

Figure 5A:
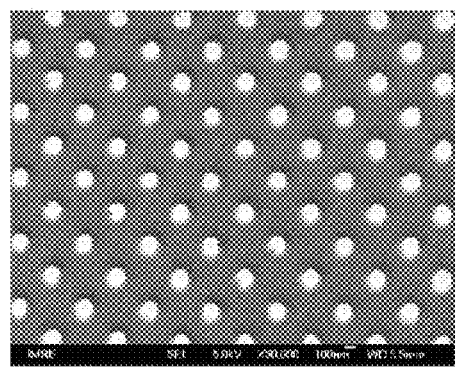
Figure 5B:
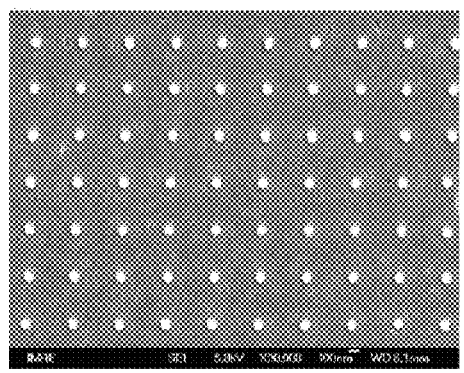
FIG. 5b is a scanning electron microscope (SEM) image at 30,000× magnification of the substrate as shown in FIG. 4b.

Referring to FIG. 5a and FIG. 5b, there are provided scanning electron microscope (SEM) images at 30,000× magnification of the substrate of FIG. 4a and FIG. 4b respectively. Significant shrinkage in feature dimensions can be seen, from columnar diameters of about 200 nm before heat-treatment, to reduced columnar diameters of about 70 nm after heat-treatment. Furthermore, it can also be seen that the center point between adjacent imprint structures does not change substantially after said heat-treatment. That is, it can be seen from the images in FIG. 5a and FIG. 5b that the shape of the imprints before and after the heat-treatment step remained substantially the same. Also, the center to center distances between adjacent structures do not substantially change.

Figure 6A:
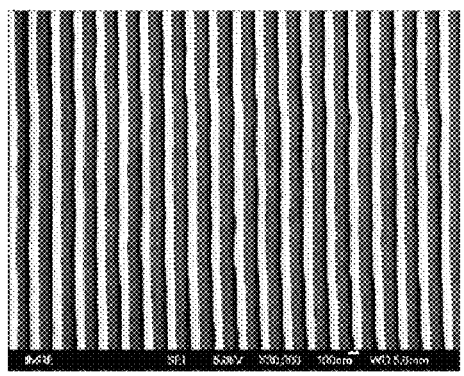
FIG. 6a is a scanning electron microscope (SEM) image at 30,000× magnification of a substrate according to one embodiment of the disclosed method, with linear imprint structures of about 100 nm line width comprising polymerized Titanium methacrylate, before heat-treatment.
Figure 6B:
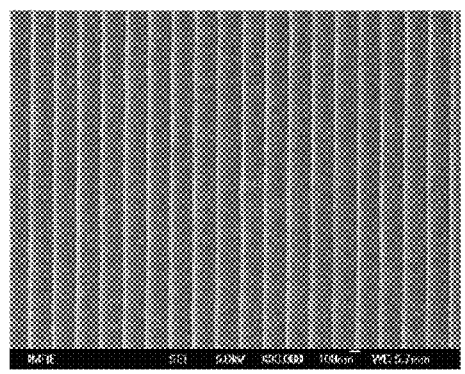
FIG. 6b is a scanning electron microscope (SEM) image at 30,000× magnification of the substrate as shown in FIG. 6a, after heat-treatment.

Referring to FIG. 6a and FIG. 6b there are provided scanning electron microscope (SEM) images at 30,000× magnification of a substrate comprising polymerized Titanium methacrylate and having linear imprint structures with line widths of about 100 nm in accordance to one embodiment of the disclosed method, before and after heat-treatment respectively. Significant shrinkage in feature dimensions can be seen, from line widths of about 100 nm before heat-treatment, to reduced line widths of about 30 nm after heat-treatment. Furthermore, it can also be seen that the center point between adjacent imprint structures does not change substantially after said heat-treatment. That is, it can be seen from the images in FIG. 6a and FIG. 6b that the shape of the imprints before and after the heat-treatment step remained substantially the same. Also, the center to center distances between adjacent structures do not substantially change.

Referring to FIG. 7a(i) and FIG. 7b(i), there are provided scanning electron microscope (SEM) images at 10,000× magnification of a substrate comprising polymerized Zirconium methacrylate and having linear imprint structures with line widths of about 250 nm in accordance to one embodiment of the disclosed method, before and after heat-treatment at 400 degrees Celsius respectively. Significant shrinkage in feature dimensions can be seen, from line widths of about 250 nm before heat-treatment, to reduced line widths of about 70 nm after heat-treatment. Furthermore, it can also be seen that the center point between adjacent imprint structures does not change substantially after said heat-treatment. The rectangular sections of the substrate as indicated in FIG. 7a(i) and FIG. 7b(i) are further magnified in FIG. 7a(ii) and FIG. 7b(ii), respectively.

Referring to FIG. 7a(ii) and FIG. 7b(ii), there are provided scanning electron microscope (SEM) images at 30,000× magnification of the substrate of FIG. 7a(i) and FIG. 7b(i) respectively. Significant shrinkage in feature dimensions can be seen, from line widths of about 250 nm before heat-treatment, to reduced line widths of about 70 nm after heat-treatment. Also, pitch widths expand from about 250 nm before heat-treatment to about 430 nm after heat-treatment. Furthermore, it can also be seen that the center point between adjacent imprint structures does not change substantially after said heat-treatment. That is, it can be seen from the images in FIG. 7a(ii) and FIG. 7b(ii) that the shape of the imprints before and after the heat-treatment step remained substantially the same. Also, the center to center distances between adjacent structures do not substantially change as well. After said heat-treatment, imprint structures show shrinkage of about 72%, while pitch widths between adjacent imprint structures show an increase of 72%.

Referring to FIG. 8a(i) and FIG. 8b(i), there are provided scanning electron microscope (SEM) images at 10,000× magnification of a substrate comprising polymerized Niobium methacrylate and having linear imprint structures with line widths of about 250 nm in accordance to one embodiment of the disclosed method, before and after heat-treatment at 400 degrees Celsius respectively. Significant shrinkage in feature dimensions can be seen, from line widths of about 250 nm before heat-treatment, to reduced line widths of about 140 nm after heat-treatment. Furthermore, it can also be seen that the center point between adjacent imprint structures does not change substantially after said heat-treatment. The rectangular sections of the substrate as indicated in FIG. 8a(i) and FIG. 8b(i) are further magnified in FIG. 8a(ii) and FIG. 8b(ii), respectively.

Referring to FIG. 8a(ii) and FIG. 8b(ii), there are provided scanning electron microscope (SEM) images at 30,000× magnification of the substrate of FIG. 8a(i) and FIG. 8b(i) respectively. Significant shrinkage in feature dimensions can be seen, from line widths of about 250 nm before heat-treatment, to reduced line widths of about 140 nm after heat-treatment. Also, pitch widths expand from about 250 nm before heat-treatment to about 360 nm after heat-treatment. Furthermore, it can also be seen that the center point between adjacent imprint structures does not change substantially after said heat-treatment. That is, it can be seen from the images in FIG. 8a(ii) and FIG. 8b(ii) that the shape of the imprints before and after the heat-treatment step remained substantially the same. Also, the center to center distances between adjacent structures do not substantially change as well. After said heat-treatment, imprint structures show shrinkage of about 44%, while pitch widths between adjacent imprint structures show an increase of 44%.

Referring to FIG. 9a(i) and FIG. 9b(i), there are provided scanning electron microscope (SEM) images at 10,000× magnification of a substrate comprising polymerized Tantalum methacrylate and having linear imprint structures with line widths of about 250 nm in accordance to one embodiment of the disclosed method, before and after heat-treatment at 400 degrees Celsius respectively. Significant shrinkage in feature dimensions can be seen, from line widths of about 250 nm before heat-treatment, to reduced line widths of about 80 nm after heat-treatment. Furthermore, it can also be seen that the center point between adjacent imprint structures does not change substantially after said heat-treatment. The rectangular sections of the substrate as indicated in FIG. 9a(i) and FIG. 9b(i) are further magnified in FIG. 9a(ii) and FIG. 9b(ii), respectively.

Referring to FIG. 9a(ii) and FIG. 9b(ii), there are provided scanning electron microscope (SEM) images at 30,000× magnification of the substrate of FIG. 9a(i) and FIG. 9b(i) respectively. Significant shrinkage in feature dimensions can be seen, from line widths of about 250 nm before heat-treatment, to reduced line widths of about 80 nm after heat-treatment. Also, pitch widths expand from about 250 nm before heat-treatment to about 420 nm after heat-treatment. Furthermore, it can also be seen that the center point between adjacent imprint structures does not change substantially after said heat-treatment. That is, it can be seen from the images in FIG. 9a(ii) and FIG. 9b(ii) that the shape of the imprints before and after the heat-treatment step remained substantially the same. Also, the center to center distances between adjacent structures do not substantially change as well. After said heat-treatment, imprint structures show shrinkage of about 68%, while pitch widths between adjacent imprint structures show an increase of 68%.

Referring to FIG. 10a(i) and FIG. 10b(i), there are provided scanning electron microscope (SEM) images at 10,000× magnification of a substrate comprising polymerized Iron methacrylate and having linear imprint structures with line widths of about 250 nm in accordance to one embodiment of the disclosed method, before and after heat-treatment at 400 degrees Celsius respectively. Significant shrinkage in feature dimensions can be seen, from line widths of about 250 nm before heat-treatment, to reduced line widths of about 70 nm after heat-treatment. Furthermore, it can also be seen that the center point between adjacent imprint structures does not change substantially after said heat-treatment. The rectangular sections of the substrate as indicated in FIG. 10a(i) and FIG. 10b(i) are further magnified in FIG. 10a(ii) and FIG. 10b(ii), respectively.

Referring to FIG. 10a(ii) and FIG. 10b(ii), there are provided scanning electron microscope (SEM) images at 30,000× magnification of the substrate of FIG. 10a(i) and FIG. 10b(i) respectively. Significant shrinkage in feature dimensions can be seen, from line widths of about 250 nm before heat-treatment, to reduced line widths of about 80 nm after heat-treatment. Also, pitch widths expand from about 250 nm before heat-treatment to about 430 nm after heat-treatment. Furthermore, it can also be seen that the center point between adjacent imprint structures does not change substantially after said heat-treatment. That is, it can be seen from the images in FIG. 10a(ii) and FIG. 10b(ii) that the shape of the imprints before and after the heat-treatment step remained substantially the same. Also, the center to center distances between adjacent structures do not substantially change as well. After said heat-treatment, imprint structures show shrinkage of about 72%, while pitch widths between adjacent imprint structures show an increase of 72%.

Referring to FIG. 11a(i) and FIG. 11b(i), there are provided scanning electron microscope (SEM) images at 10,000× magnification of a substrate comprising polymerized Silicon methacrylate and having linear imprint structures with line widths of about 250 nm in accordance to one embodiment of the disclosed method, before and after heat-treatment at 400 degrees Celsius respectively. Significant shrinkage in feature dimensions can be seen, from line widths of about 250 nm before heat-treatment, to reduced line widths of about 80 nm after heat-treatment. Furthermore, it can also be seen that the center point between adjacent imprint structures does not change substantially after said heat-treatment. The rectangular sections of the substrate as indicated in FIG. 11a(i) and FIG. 11b(i) are further magnified in FIG. 11a (ii) and FIG. 11b(ii), respectively.

Referring to FIG. 11a(ii) and FIG. 11b(ii), there are provided scanning electron microscope (SEM) images at 30,000× magnification of the substrate of FIG. 11a(i) and FIG. 11b(i) respectively. Significant shrinkage in feature dimensions can be seen, from line widths of about 250 nm before heat-treatment, to reduced line widths of about 80 nm after heat-treatment. Also, pitch widths expand from about 250 nm before heat-treatment to about 420 nm after heat-treatment. Furthermore, it can also be seen that the center point between adjacent imprint structures does not change substantially after said heat-treatment. That is, it can be seen from the images in FIG. 11a(ii) and FIG. 11b(ii) that the shape of the imprints before and after the heat-treatment step remained substantially the same. Also, the center to center distances between adjacent structures do not substantially change as well. After said heat-treatment, imprint structures show shrinkage of about 68%, while pitch widths between adjacent imprint structures show an increase of 68%.

APPLICATIONS

The disclosed method of reducing the dimension of an imprint structure on a substrate is a simple yet effective way of obtaining imprint structures in the nanoscale range, particularly 100 nm or less. Advantageously, the disclosed method is capable of directly forming imprint structures of metal/metalloid and metal/metalloid oxides on a silicon substrate without the step of etching. More advantageously, the substrate having the imprint structures of metal/metalloid and metal/metalloid oxides formed by the disclosed method may be used in solar cells, sensors, displays, bit pattern media and ferroelectric random access memory (FeRAM). In addition, the ability of the disclosed method to directly pattern semiconductor oxides such as silicon dioxide ($SiO_2$) makes it also useful for fabricating nanopatterned molds. Accordingly, the fabrication of nanofeatured molds may be carried out by the disclosed method without relying on relatively more expensive methods like electron-beam etching and focused-ion beam etching.

As the disclosed method is able to directly pattern the substrate with metals and metal oxides without the need of additional steps such as etching, defects arising from elaborative methods of etching may be avoided. Furthermore, the disclosed method requires relatively less steps to form nano-sized structures than known methods, thus enhancing throughput relative to such known methods.

Advantageously, the disclosed method allows molds with imprint-forming features of micro size to be used to produce final imprint structures of nano size. Advantageously, this translates to overall operational costs savings as the molds with smaller forming features are relatively more expensive than those with larger imprint forming features.

While reasonable efforts have been employed to describe equivalent embodiments of the present invention, it will be apparent to the person skilled in the art after reading the foregoing disclosure, that various other modifications and adaptations of the invention may be made therein without departing from the spirit and scope of the invention and it is intended that all such modifications and adaptations come within the scope of the appended claims.

The invention claimed is:

1. A method of reducing a dimension of an imprint structure on a substrate, the method comprising the steps of:
    (a) coating a monomer-composite composition comprising an admixture of a polymerizable monomeric composition and an inorganic moiety on said substrate;
    (b) contacting a mold having an imprint-forming surface with said monomer-composite composition, wherein said substrate and said mold are not the same;
    (c) polymerizing said monomer-composite composition while in contact with said mold to form an imprint structure formed of an inorganic-organic compound comprising said inorganic moiety and a polymer moiety, said polymer moiety having a lower vaporization temperature than the melting point of said inorganic moiety on said substrate;
    (d) removing said mold from said imprint structure; and
    (e) selectively removing at least part of the polymer moiety while enabling at least part of the inorganic moiety to form a substantially continuous inorganic phase in said imprint structure, wherein the removal of the at least part of the polymer moiety from the imprint structure reduces the dimension of the imprint structure,
wherein said inorganic moiety does not include silicon.

2. The method as claimed in claim 1, wherein the selectively removing step (e) comprises the step of heating said imprint structure.

3. The method as claimed in claim 1 or 2, wherein the inorganic moiety is substantially homogenously dispersed throughout said polymer moiety.

4. The method as claimed in claim 1, comprising the step of providing said polymer moiety being comprised of at least one of an allyl, a vinyl or an acrylate polymer.

5. The method as claimed in claim 1, wherein the inorganic moiety comprises at least one of a metal or metalloid.

6. The method as claimed in claim 5, wherein the metal or metalloid is selected from the group consisting of Titanium, Zirconium, Niobium, Tantalum, Iron, Copper, Silver, and Zinc.

7. The method as claimed in claim 1, wherein the imprint structure is:
    (i) a generally elongate imprint having a length dimension parallel to a longitudinal axis that is generally parallel to said substrate, said length dimension being defined between a proximal end and a distal end; or
    (ii) a projection having a longitudinal axis that is generally normal to said substrate and wherein the projection extends from a proximal end from said substrate to a distal end.

8. The method as claimed in claim 7, wherein the length dimension is at least two folds greater than the width dimension of the imprint.

9. The method as claimed in claim 1, wherein, after said selectively removing step, the imprint structure has at least one of the following properties:
    (i) the imprint structure has substantially the same aspect ratio as the imprint before the selectively removing step; and/or
    (ii) the imprint structure has a dimension that is reduced by at least 30% of the dimension of the imprint structure before said selectively removing step.

10. The method as claimed in claim 1, wherein an array of imprints is disposed on said substrate.

11. The method as claimed in claim 10, wherein the array is an ordered array of a series of rows and columns of imprints being disposed on said substrate at an approximately equal distance from each other.

12. The method as claimed in claim 7, wherein each imprint has a centre point defined along a central longitudinal axis and between said proximal and distal ends, and wherein the center point between adjacent imprints does not substantially change during said selectively removing step.

13. The method as claimed in claim 1, wherein said polymerizing step is undertaken at a temperature of from 60 degrees Celsius to 150 degrees Celsius.

14. The method as claimed in claim 1, wherein the polymerizing step is carried out in the presence of ultraviolet radiation.

15. The method as claimed in claim 1, wherein the selectively removing step is carried out at a temperature of from 300 degrees Celsius to 900 degrees Celsius.

16. The method as claimed in claim 1, wherein the imprint after said selectively removing step has a dimension in the nanoscale size range.

17. The method as claimed in claim 1, comprising the step of providing a minimum amount of inorganic moiety in the inorganic-organic compound such that after said polymer moiety has been selectively removed, the shape of the imprint is substantially the same.

18. The method as claimed in claim 17, wherein the step of providing a minimum amount of inorganic moiety in the inorganic-organic compound comprises reacting an inorganic compound with at least one of an allyl, a vinyl, a methacrylic or an acrylic acid in a molar ratio of about 1:8 to about 1:2.

19. The method as claimed in claim 18, wherein the inorganic compound is at least one of a metal alkoxide and a metalloid alkoxide.

* * * * *